US007085992B2

(12) United States Patent
Becker et al.

(10) Patent No.: US 7,085,992 B2
(45) Date of Patent: Aug. 1, 2006

(54) METHOD AND DEVICE FOR DECODING A SEQUENCE OF PHYSICAL SIGNALS, RELIABILITY DETECTION UNIT AND VITERBI DECODING UNIT

(75) Inventors: Burkhard Becker, Ismaning (DE); Markus Doetsch, Schliern (DE); Peter Jung, Otterberg (DE); Tideya Kella, München (DE); Jörg Plechinger, München (DE); Alfredo Ruscitto, Turin (IT)

(73) Assignee: Infineon Technologies AG (DE)

( * ) Notice: Subject to any disclaimer, the term of this patent is extended or adjusted under 35 U.S.C. 154(b) by 376 days.

(21) Appl. No.: 10/381,542

(22) PCT Filed: Oct. 24, 2001

(86) PCT No.: PCT/DE01/04040

§ 371 (c)(1),
(2), (4) Date: Aug. 4, 2003

(87) PCT Pub. No.: WO02/35820

PCT Pub. Date: May 2, 2002

(65) Prior Publication Data

US 2004/0044947 A1 Mar. 4, 2004

(30) Foreign Application Priority Data

Oct. 24, 2000 (DE) ............................... 100 52 709

(51) Int. Cl.
*H03M 13/03* (2006.01)
(52) U.S. Cl. .................. 714/795; 714/792; 714/794; 714/796; 375/341; 375/262
(58) Field of Classification Search ........ 714/791–792, 714/794–796; 375/262, 341
See application file for complete search history.

(56) References Cited

U.S. PATENT DOCUMENTS 5,185,747 A * 2/1993 Farahati ...................... 714/795

(Continued)

FOREIGN PATENT DOCUMENTS

| EP | 0670636 A1 | 9/1995 |
| EP | 0800280 A1 | 10/1997 |
| GB | 2305827 A | 4/1997 |

OTHER PUBLICATIONS

G.D. Forney, The Viterbi-Algorithm, Proceedings of the IEEE, vol. 61, No. 3, pp. 268-278, 1973.

(Continued)

*Primary Examiner*—Guy J. Lamarre
(74) *Attorney, Agent, or Firm*—Altera Law Group, LLC; Jeffrey R. Stone

(57) ABSTRACT

A method and device for decoding a sequence of physical signals. A Viterbi algorithm is carried out a first time for all physical signals, resulting in a maximum likelihood path, wherein there is one signal value for each physical signal and which has been determined along the entire trellis according to the Viterbi algorithm. A reliability value is determined for each signal value of the maximum likelihood path. The Viterbi algorithm is then carried out a second time with the following steps: selecting one subregion of the trellis, the subregion having a partial initial signal value and a partial end signal value on the maximum likelihood path; determining one further path in that subregion of the trellis which ends at the partial end signal value of the maximum likelihood path; determining each signal value on the further path and comparing same with the corresponding signal value on the maximum likelihood path relating to the same time; depending on the comparison result, the signal value of the maximum likelihood path is allocated the reliability value determined in the previous iteration step or the minimum of this and the reliability value of the partial end signal value; shifting the subregion of the trellis by at least one time unit; and using, storing and/or outputting the determined signal values and selected reliability values associated with the signal values as the decoded sequence.

21 Claims, 8 Drawing Sheets

U.S. PATENT DOCUMENTS

| | | | |
|---|---|---|---|
| 5,406,570 A | | 4/1995 | Berrou et al. |
| 5,479,419 A | * | 12/1995 | Naoi et al. ................. 714/794 |
| 5,548,684 A | * | 8/1996 | Wang et al. ................. 706/16 |
| 5,784,392 A | | 7/1998 | Czaja et al. |
| 5,822,340 A | | 10/1998 | Stenstrom et al. |
| 5,995,562 A | * | 11/1999 | Koizumi ..................... 375/341 |
| 6,487,694 B1 | * | 11/2002 | Bajwa ........................ 714/768 |
| 6,581,182 B1 | * | 6/2003 | Lee ............................ 714/795 |

OTHER PUBLICATIONS

J. Hagenauer, P. Hoeher, A Verterbi Algorithm with Soft-Decision Outputs and its Applications. pp. 1680-1686, Globecom, 1989.

J. Hagenauer, Source-Controlled Channel Decoding, IEEE Transaction on Communications, vol. 43, No. 9, pp. 2449-2457, Sep. 1995.

C. Berrou et al., A Low Complexity Soft-Output Viterbi Decoder Architecture, ICC 93.

Patent Abstracts of Japan, vol. 1999, No. 12, Oct. 29, 1999, JP 11 186914 A (Matsushita Electric Ind Co Ltd), Published Jul. 9, 1999, cited in the application abstract.

Taek Won Kwon et al., "A modified two-step SOVA-based turbo decoder for low power and high performance." Tencon 99. Proceedings of the IEEE Region 10 Conference Cheju Island, South Korea, Sep. 15-17, 1999, Piscataway, NJ, USA IEEE, US, Sep. 15, 1999, pp. 297-300, XP010368291, ISBN: 0-7803-5739-6.

* cited by examiner

METHOD AND DEVICE FOR DECODING A SEQUENCE OF PHYSICAL SIGNALS, RELIABILITY DETECTION UNIT AND VITERBI DECODING UNIT

BACKGROUND OF THE INVENTION

1. Field of the Invention

The invention relates to a method and a device for decoding a sequence of physical signals.

2. Description of the Related Art

A method such as this and a device such as this are known from G. D. Forney, The Viterbi-Algorithm, Proceedings of the IEEE, Vol. 61, No. 3, pages 268–278, 1973 (hereinafter referred to as "Forney").

Forney describes the principles of the so-called Viterbi algorithm.

The Viterbi algorithm, which is frequently used for channel decoding of received physical signals that are subject to disturbances, determines a sequence of signal values along a so-called trellis for the received physical signals. The probability of the determined sequence of signal values corresponding to the sequence of received physical signals is in each case maximized for the sequence of signal values. The procedure which is known from Forney is used to make a decision on a binary basis for each signal value as to whether a signal value has a first binary value or a second binary value.

The procedure which is known from Forney has the particular disadvantage that, during the decoding process, it is not evident how reliable the decision is as to whether the respectively determined signal value actually corresponds to the originally transmitted signal value.

The method from Forney therefore provides no reliability information whatsoever on the quality of the channel decoding process.

In order to improve the method which is known from Forney, it is known from J. Hagenaur, P. Hoeher, A Viterbi Algorithm with Soft-Decision Outputs and its Applications, pages 1680–1686, GLOBECOM, 1989 (hereinafter Hagenaur, et al.) for each determined signal value to be allocated reliability information, which is referred to as a reliability value in the following text, in the course of the channel decoding of the received, noisy (that is to say subject to disturbances) physical signal. The reliability value in each case indicates the reliability of the respective decision which has been made to classify the received signal as the corresponding signal value. This obviously means that the reliability value indicates the extent to which the received signal is similar to the first binary signal value or to the second binary signal value.

The reliability values are formed, for example, as a function of so-called state metrics which are calculated while passing through the trellis in the course of the channel decoding process.

In the method which is known from Hagenauer, et al., the reliability values are determined in the course of a single run through the Viterbi algorithm.

However, it has been found that this procedure is not optimal, especially and in addition with regard to implementation in hardware.

In order to improve the procedure which is known from Hagenauer, et al., the method which is described in J. Hagenauer, Source-Controlled Channel Decoding, IEEE Transaction on Commucications, Vol. 43, No. 9, pages 2449–2457, September 1995 (hereinafter "Hagenauer") has been developed, in which the Viterbi algorithm is run twice, with only the signal values being determined in the course of the first "run", and the reliability values being determined in the course of a second run. The result of the first "run" is a "maximum likelihood path" which contains those signal values which have been determined using a path traceback method (backtracing method). The signal values which are located on the maximum likelihood path are used as the decoded physical signals.

In the procedure which is known from Hagenauer, while the second run of the Viterbi algorithm is carried out for a large number of further paths along the entire trellis, with the further paths all having the same length as the maximum likelihood path, namely the length corresponding to the sequence of received physical signals, reliability values are determined and the respective reliability value associated with the signal value is determined as a function of the reliability values of the signal values of the maximum likelihood path and determined reliability values for signal values on the further paths.

This procedure is highly complex and, in practice, cannot be used in real time for the decoding of physical signals, in particular in the field of mobile radio.

It is also known from C. Berrou, et al., A Low complexity Soft-Output Viterbi Decoder Architecture, ICC 93 (hereinafter "Berrou, et al."), and U.S. Pat. No. 5,406,570 (hereinafter "U.S. Pat. No. '570") for the Viterbi algorithm not to be carried out for the entire sequence of physical signals but only for a partial sequence and for the signal values to be determined step-by-step along the trellis, with further paths being formed in the course of the Viterbi algorithm and further reliability values being allocated to the determined signal values for these further paths, which further reliability values are compared with the reliability values of the signal values on the maximum likelihood path, which has not yet been completely determined at this time, on the basis of which the final reliability values which are associated with the determined signal values are chosen.

The method which is known from Berrou, et al. and U.S. Pat. No. '570, has the particular disadvantage that convergence of the Viterbi algorithm is not always guaranteed for each of the subregions which are taken into account in order to determine the further paths.

Another method for determining a maximum likelihood path is known from Patent Abstracts of Japan JP 11186914 A (hereinafter "JP11186914 A"). In this method, a first maximum likelihood path is determined, and an additional quasi-maximum likelihood path is then chosen, and its reliability values are compared with those of the first maximum likelihood path.

Another Viterbi decoder is described in U.S. Pat. No. 5,784,392 (hereinafter "U.S. Pat. No. '392).

BRIEF SUMMARY OF THE INVENTION

The invention is thus based on the problem of determining reliability values for signal values in the course of the Viterbi algorithm, with the determined reliability values having a reliability which is better than that of the known methods in the stochastic sense, or is at least equivalent to them. Furthermore, it is intended to be possible to use the method for mobile radio, in which case it is desirable for the computation complexity both in software and in hardware to be as low as possible.

The problem is solved by the method, the device, the reliability value determining unit and the Viterbi decoding unit having the features of the independent patent claims.

In a method for decoding a sequence of physical signals, a Viterbi algorithm is carried out a first time for all physical signals. The first "run" of the Viterbi algorithm results in a maximum likelihood path which has been determined along the entire trellis that results according to the Viterbi algorithm. The maximum likelihood path has one signal value for each physical signal. A reliability value is determined for each signal value of the maximum likelihood path determined using the Viterbi algorithm. The Viterbi algorithm is now carried out a second time, with the following method steps being carried out iteratively until all the signal values of the determined trellis have been taken into account:

one subregion of the trellis is selected, with that subregion having a partial initial signal value and a partial end signal value on the maximum likelihood path, at least one further path is determined in that subregion of the trellis which ends at the partial end signal value of the maximum likelihood path, each signal value on the further path is determined and is compared with the corresponding signal value on the maximum likelihood path relating to the same time, depending on the comparison result, the signal value of the maximum likelihood path is allocated the reliability value determined in the previous iteration step or the minimum of this and the reliability value of the partial end signal value, in a subsequent iteration step, the subregion of the trellis is preferably shifted by at least one time unit.

The determined signal values and the selected reliability values associated with the signal values, as have been determined on the basis of the second run of the Viterbi algorithm, are used and stored and/or output as the decoded sequence.

A device for coding a sequence of physical signals has a processor which is set up such that the method steps, as described above, in the method for decoding a sequence of physical signals can be carried out.

A reliability value determining unit for determining a reliability value in the course of a Viterbi algorithm has a first path memory for storing signals of a maximum likelihood path according to the Viterbi algorithm. Furthermore, a second path memory is provided, for storing signal values of a further path according to the Viterbi algorithm. A first selection unit is coupled to the first path memory and to the second path memory, and is used for evaluating signal values from the first path memory and from the second path memory. A comparison unit is coupled to the selection unit and is used for comparing the chosen signal values from the first path memory and those from the second path memory with one another. A second selection unit has a control input, a first input and a second input. The control input is coupled to the output of the comparison unit. The first input is coupled to the output of a third selection unit. Furthermore, a reliability value memory is provided for storing reliability values. A control unit which is also provided is set up such that a previously determined and stored first reliability value, which is associated with a signal value on the maximum likelihood path, can be read from the reliability value memory and can be supplied to a first input of the third selection unit. Furthermore, the control unit is set up such that a previously determined and stored second reliability value, which is associated with a signal value on the maximum likelihood path, can be supplied from the reliability value memory to a second input of the third selection unit. The control unit is furthermore set up such that the first reliability value can be supplied to the second input of the second selection unit. If the selected signal values from the first path memory and from the second path memory are not the same, the comparison unit can supply a control signal to the second selection unit such that the second selection unit can select the reliability value which is present at its first input and has been chosen by the third selection unit.

A Viterbi decoding unit has the reliability value determining unit described above.

The invention results in improved decoding of the sequence of physical signals using the Viterbi algorithm. In particular, the quality is improved, that is to say the stochastic reliability of the reliability values which are associated with the respective signal values and are output as soft decision values by the Viterbi decoder, as a result of which the reliability of the individual signal values for their further processing is improved.

It should be noted that, according to the invention, the maximum likelihood path has been determined along the overall trellis that results according to the Viterbi algorithm before the Viterbi algorithm is carried out a second time, and that the signal values of further paths are compared with the signal values of the maximum likelihood path in the course of the second run.

Preferred developments of the invention can be found in the dependent claims.

The refinements of the invention which are described in the following text relate not only to the method, the device and the reliability value determining unit, but also to the Viterbi decoding unit.

A binary value may be used as the signal value. This refinement simplifies the implementation of the invention since only binary values need be processed, as a result of which, for example, only one bit is required for each signal value for the purposes of storing the signal values.

A further refinement of the invention provides for at least one initial signal value to be predetermined at the start of the sequence of physical signals and/or for at least one end signal value to be predetermined at the end of the sequence of physical signals.

A region which has a predetermined number of signal values can be selected as the subregion of the trellis that is to be selected.

According to one refinement of the invention, a number of signal values, with this number being dependent on the reversion depth of the convolution polynomials that are used, are in each case used as a subregion of the trellis.

The further path can in each case be determined in one iteration by inverting the signal value of the signal value which is passed to the respective partial end signal value according to the maximum likelihood path, and a renewed path traceback method is carried out on the basis of the partial end signal value, starting with the inverted signal value. The renewed path traceback method makes use of path traceback information which was determined during the first run of the Viterbi algorithm or which occurs once again during the second run.

Each signal value on the maximum likelihood path is compared with the signal value of the further concurrent path. If the comparison results in a match, then the reliability value of the signal value which is located on the maximum likelihood path is not changed. If the comparison does not result in a match, then the minimum of the reliability value determined in a previous iteration and the reliability value of the partial end signal value is used for the relevant signal value on the maximum likelihood path.

The difference from accumulated signal value metrics which are formed while running the Viterbi algorithm may be used as a first approximation of the reliability value.

In one development of the invention, the second selection unit is a multiplexer.

According to a further refinement of the invention, the first selection unit is set up such that signal values relating to the same time unit are in each case selected.

The third selection unit can be set up such that it selects the lower reliability value of the first reliability value and the second reliability value.

According to a further refinement of the invention, the following components are provided in the device:
- a transition metrics determining unit for determining a transition metric,
- an end state metric determining unit, which is coupled to the transition metric determining unit, for determining an end state metric,
- a reliability value determining unit which is coupled to the end state metric determining unit, and
- a path traceback unit, which is coupled to the reliability value determining unit and to the end state metric determining unit, for determining path traceback information.

Furthermore, a memory can be provided,
- with a memory area for storing path traceback information and/or
- having a second memory area for storing soft input information for the decoding unit and/or
- with a third memory area for storing determined state metrics and state transition metrics and/or
- with a fourth memory area for storing signal values which are intended to be output, and reliability values associated with the signal values.

At least one of the memory areas may be in the form of RAM, so that the respective memory areas are integrated in the electrical circuit, thus furthermore considerably speeding up the decoding process.

Furthermore, the path traceback unit may have the following components:
- a control unit, and
- a multiplexer which is coupled via a control input to the control unit,
  - in which case it is possible to use the control unit to select whether information about the maximum likelihood path or about the respective further concurrent path is selected by the first multiplexer,
  - in which case the respective start state for the path traceback method within the further concurrent path can be supplied to a first input of the first multiplexer,
  - in which case information as to whether a transition bit is intended to be inverted for the traceback of the further path can be supplied as a second input of the first multiplexer,
  - in which case the respective time to which the start state relates can be supplied at a third input of the first multiplexer,
  - in which case the respective start state of the maximum likelihood path can be supplied at a fourth input of the first multiplexer, and
  - in which case the respective time to which the start state of the maximum likelihood path relates can be supplied as a fifth input of the first multiplexer.

One exemplary embodiment of the invention will be explained in more detail in the following text and is illustrated in the figures, in which:

DETAILED DESCRIPTION OF THE INVENTION

Figure 2:
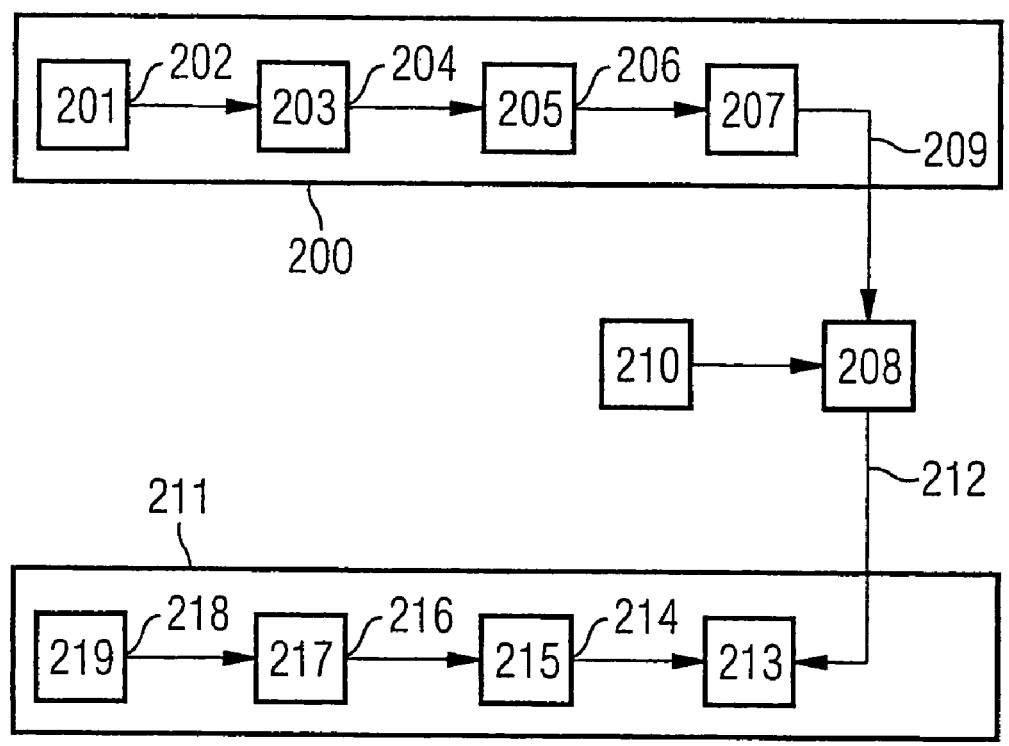
FIG. 2 shows a block diagram, illustrating the sending, the transmission and the reception of an electrical physical signal.

FIG. 2 shows, symbolically, a source 201 from which a message 202 is intended to be transmitted from a transmitter 200 to a sink 219 in a receiver 211.

The message 202 to be transmitted is supplied to a source coder 203, where it is compressed such that, although no information is lost, redundant information that is superfluous for the decoding of the message 202 is eliminated, and the required transmission capacity is thus reduced.

The source coder 202 emits a code word 204

$$\underline{u} \in \{\pm 1\}^k, \quad (1)$$

which consists of a sequence of digital values. In this case, the assumption is made for each code word 204 $\underline{u}$ that each value $u_i$, i=1, ..., k, of each code word 204 $\underline{u}$ has an equal probability of assuming a first binary value (logic "0") or a second binary value (logic "1").

The code word 204 $\underline{u}$ is supplied to a unit for channel coding 205, in which channel coding of the code word 204 $\underline{u}$ is carried out. During the channel coding process, redundant information is deliberately added to the code word 204 $\underline{u}$ in order to make it possible to correct, or at least to identify, any transmission errors which may occur during the transmission process, thus achieving a high level of transmission reliability.

The following text is based on the assumption that the channel coding process results in each code word 204

$$\underline{u} \in \{\pm 1\}^k$$

being allocated a channel code word 206

$$\underline{c} \in \{\pm 1\}^n, \; n>k, \; n \in \mathbb{N} \quad (2).$$

The output of the unit for channel coding 205 thus consists of the channel code word $\underline{c}$ 206.

The channel code word $\underline{c}$ 206 is supplied to a unit for modulation 207 of the channel code word $\underline{c}$ 206.

During the modulation process, the channel code word $\underline{c}$ 206 is associated with a function $$s = \mathfrak{R} \to \mathfrak{R} \quad (3)$$

which is suitable for transmission via a physical channel 208.

The modulated signal 209 to be transmitted thus contains both signal information and redundant information determined from the signal information.

The modulated signal s 209 is transmitted via the physical channel 208 to a receiver 211. During the transmission process via the physical channel 208, disturbances 210 frequently occur, which corrupt the modulated signal 209 s.

At the receiver 211, this results in a modified modulated signal 212

$$\tilde{s} : \Re \to \Re, \quad (4)$$

which is supplied to a unit for demodulation 213 in the receiver 211.

The modified modulated signal s 212 is demodulated in the unit for demodulation 213. The unit for demodulation 213 outputs a vector $$\underline{y} \in \Re^n, \quad (5)$$

which is referred to as an electrical signal 214 in the following text and describes the digital, demodulated, modified signal.

The electrical signal $\underline{y}$ 214 is supplied to a unit for channel decoding 215 of the electrical signal $\underline{y}$ 214, where it is subjected to a Viterbi algorithm (which will be described in the following text) for channel decoding of the electrical signal $\underline{y}$ 214. A sequence of electrical signals $\underline{y}$ is also referred to in the following text as a sequence of physical signals.

The object of the channel decoding process is to carry out so-called soft decision decoding. This means that a code word is reconstructed and, furthermore, reliability information (a reliability value) is determined for each component, describing the decision made with regard to reconstruction of a component of the code word. A component of the reconstructed code word 216 is referred to in the following text as a digital signal value.

The reconstructed code word 216, that is to say at least one digital signal value, is supplied to a unit for source decoding 217, in which source decoding is carried out.

Finally, the decoded signal 218 is supplied to the sink 219.

In order to make it easier to understand the invention, the outline structure of the Viterbi algorithm will be explained in the following text (see FIG. 3). Details of the Viterbi algorithm are described in Forney.

Figure 3:
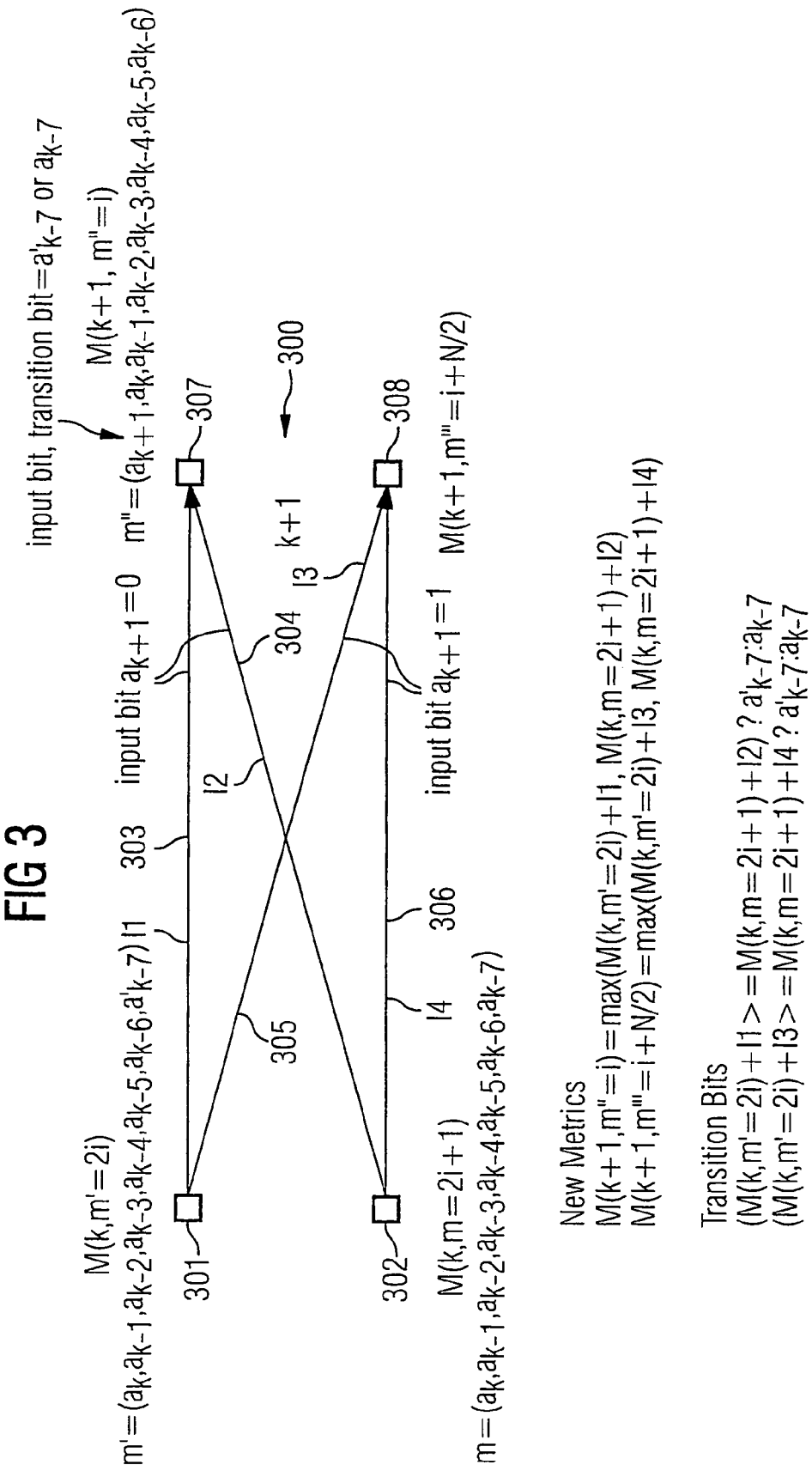
FIG. 3 shows a sketch of a butterfly structure, on the basis of which the Viterbi algorithm will be explained in more detail.

For the purposes of this exemplary embodiment, a binary modulated signal is assumed, that is to say the Viterbi algorithm can be run using a trellis which can be implemented by means of a butterfly structure 300, as is illustrated in FIG. 3.

On the basis of the butterfly structure 300, two initial states, a first initial state m' 301 and a second initial state m 302, are in each case provided. The first initial state m' 301 is obtained from the product of a state index i and the factor 2 (m'=2i) where, if an eight-bit word is to be processed, i=0, ..., 127 ($2^7$), and the second state m 302 is obtained for the respective state index i on the basis m=2i+1.

At a time k, each initial state 301, 302 is allocated a state metric M so that, for the first initial state m' 301, the state metric relating to the time k is thus indicated by M(k, m'=2i) and, for the second initial state m 302, the state metric relating to the time k is indicated by M(k, m=2i+1).

Without any restriction to generality, the rest of the description is based by way of example on the statements relating to the UMTS standard. The statements are equally applicable to the GSM/EDGE standard, with a state in the GSM/EDGE standard being described by 6 bits or 4 bits, respectively.

According to the exemplary embodiment, in which the physical signals are transmitted in accordance with the UMTS standard, a state with an 8-bit word is preferably described, that is to say, if $a_k$ denotes a value of a bit at the time k, the first initial state is given by 301 m'=($a_k$, $a_{k-1}$, $a_{k-2}$, $a_{k-3}$, $a_{k-4}$, $a_{k-5}$, $a_{k-6}$, $a'_{k-7}$) and the second initial state m 302 is given by m=($a_k$, $a_{k-1}$, $a_{k-2}$, $a_{k-3}$, $a_{k-4}$, $a_{k-5}$, $a_{kk-6}$, $a_{k-7}$).

Analogously to the procedure in a shift register, a state transition takes place by inputting ("shifting from the left") a new bit value $a_{k+1}$ relating to the time k+1, symbolized in FIG. 3 by state transition arrows 303, 304, 305, 306 to a first end state m" 307 and to a second end state m'" 308.

The state transition, caused by the "shifting in" of the bit $a_{k+1}$ results, for the first end state 307 relating to the time k+1 (with the state metric M(k+1, m"=i)) in:

$$m'' = (a_{k+1}, a_k, a_{k-1}, a_{k-2}, a_{k-3}, a_{k-4}, a_{k-5}, a_{k-6}).$$

The second end state 308 likewise has an associated state metric $$M\left(k+1, m''' = i + \frac{N}{2}\right).$$

Transition metrics I1, I2, I3, I4 are determined using the Viterbi algorithm.

As can be seen, I1 clearly indicates the probability for a state transition to the state m" when the bit $a_{k+1}$ has the logic value "zero" and the trellis was in the first initial state m' 301.

As can be seen, I2 clearly indicates the probability of a state transition to the state m" when the bit $a_{k+1}$ has the logic value "zero" and the trellis was in the second initial state m 302.

As can be seen, I3 denotes the probability of a state transition to the state m'" when the bit $a_{k+1}$ has the logic value "one" and the trellis was in the first initial state m' 301.

As can be seen, I4 denotes the probability of a state transition to the state m'" when the bit $a_{k+1}$ has the logic value "one" and the trellis was in the second initial state m 302.

The new state metrics for the two end states m" and m'" are obtained using the Viterbi algorithm in accordance with the following rules:

$$M(k+1, m''=i) = \max(M(k, m'=2i)+I1, M(k, m=2i+1)+I2),$$

$$M\left(k+1, m''' = i + \frac{N}{2}\right) = \max(M(k, m'=2i)+I3, M(k, m=2i+1)+I4),$$

where N denotes the number of states in the trellis, that is to say, for 8 bits, N=256 states.

In accordance with the Viterbi algorithm, a forward determination process is used, starting at a defined initial state which according to the UMTS standard comprises a number, which can be predetermined, of bits with the logic value "0", for a successive determination process such that the state metrics for one point in time are determined for all the initial states of the trellis, and the respective state transition metrics are determined in accordance with the butterfly structure 300.

Once the two state transition metrics have each been determined which both lead to the same end state starting from different initial states, then the sum of the respective state metrics and transition metrics is in each case formed, and the larger sum is selected and is allocated as the state metric to the corresponding end state 307, 308.

The bit $a'_{k-7}$, $a_{k-7}$ of the respective initial state selected by the maximum selection process is stored in a path traceback register.

The method described above is carried out for all the states and all the time steps in the trellis until the overall end state of the sequence of physical signals, as defined in accordance with the UMTS standard, is reached. The overall end state of the sequence of physical signals in accordance with the UMTS standard is once again a predetermined number of bits with the logic value "zero" (the sequence of physical signals is terminated and is also referred to as "tail bits").

Thus, as can be seen, based on the forward method, the information relating to the selected path of the two state transitions, or expressed in other words information about the initial state which has passed through the state transition to the respective end state of the butterfly structure 300, is thus in each case stored. The respective end state and the corresponding initial state differ only in two bits, in the following manner:

One new bit has been shifted into the "shift register" (the bit $a_{k+1}$) and one bit (the "oldest", that is to say the least significant bit $a'_{k-7}$ or $a_{k-7}$, which is referred to as the transition bit in the following text) has been shifted out of the "shift register".

Since the bit $a_{k+1}$ that has been shifted in is part of the direct designation of the respective end state, it is sufficient to store only the transition bit $a'k_{-7}$ or $a_{k-7}$ in the path traceback register in order to make it possible to uniquely determine the maximum likelihood path as described in the following text.

During the path traceback method, the transition bits $a'_{k-7}$ and $a_{k-7}$ are used in conjunction with the knowledge about the overall end state of the Viterbi algorithm which, in accordance with the UMTS standard, ends in the overall end state with the logic value "zero", in order to reconstruct the maximum likelihood path in the trellis.

Figure 4:
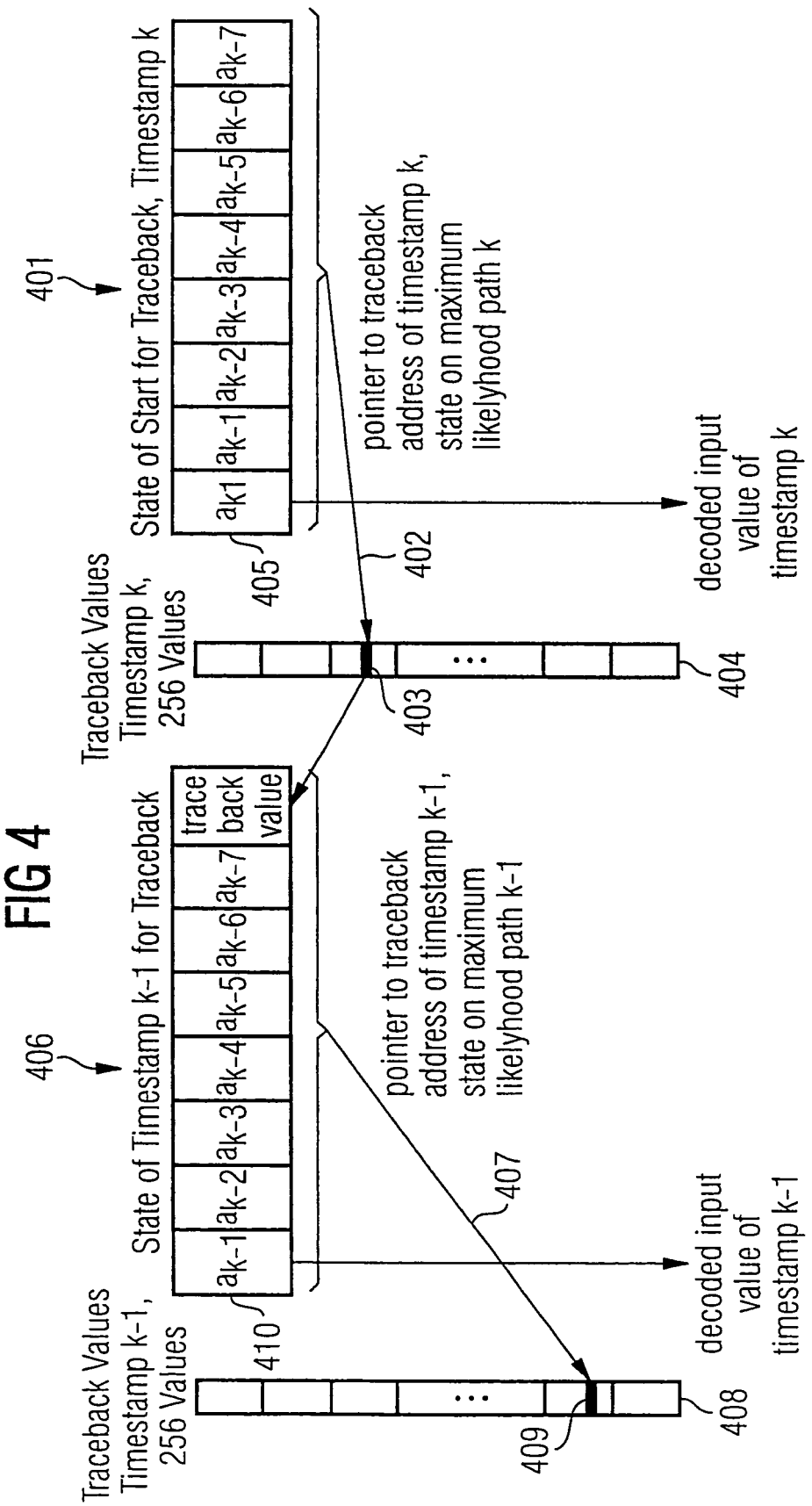
FIG. 4 shows a block diagram illustrating a path traceback method.

As is shown in FIG. 4, a start state 401 is known for the path traceback method, with the assumption being made that the path traceback method is started at the time k. The start state 401 is denoted by the bits $a_k$, $a_{k-1}$, $a_{k-2}$, $a_{k-3}$, $a_{k-4}$, $a_{k-5}$, $a_{k-6}$, $a_{k-7}$ and forms a pointer 402 to an address in a path traceback register 404 for the time step k, which contains 256 values for a word length of 8 bits. 256 bits are stored for the time step k in the path traceback register 404 and can each be addressed uniquely by the 8 bits of the start state 401.

The addressed bit 403 in the path traceback register 404 for the time k is read, and the 8 bits $a_k$, $a_{k-1}$, $a_{k-2}$, $a_{k-3}$, $a_{k-4}$, $a_{k-5}$, $a_{k-6}$, $a_{k-7}$, which form the start state 401 relating to the time k, are shifted "from the right" into the shift register. The most significant bit $a_k$ relating to the time k is accordingly shifted out of the shift register and is used as the decoded signal value 405 relating to the time k.

The new word which is located in the shift register and which forms a path traceback state 406 relating to the time k-1 ($a_{k-1}$, $a_{k-2}$, $a_{k-3}$, $a_{k-4}$, $a_{k-5}$, $a_{k-6}$, $a_{k-7}$, selected bit 403 from the path traceback register 404 relating to the time k) is once again used as a pointer 407 to a bit in a path traceback register 408 for the time k-1. The addressed bit 409 in the path traceback register 408 for the time k-1 is read, and a further state transition takes place in a further path traceback state relating to the time k-2. The most significant bit $a_{k-1}$ relating to the time k-1 is accordingly shifted out of the shift register and is used as the decoded signal value 410 relating to the time k-1.

The method sketched above is carried out for all the points in time until the initial state of the trellis, that is to say the time at which the first physical signal was received, has been determined.

It should be noted that each path traceback register relating to each time with a word length of 8 bits has 256 bits for 256 states in each case.

Based on this first "run" of the Viterbi algorithm, the path traceback method results in the so-called maximum likelihood path 501.

Once the maximum likelihood path 501 shown in the trellis 500 in FIG. 5 has been determined, the Viterbi algorithm is carried out a second time, based on the procedure described in the following text.

Figure 5:
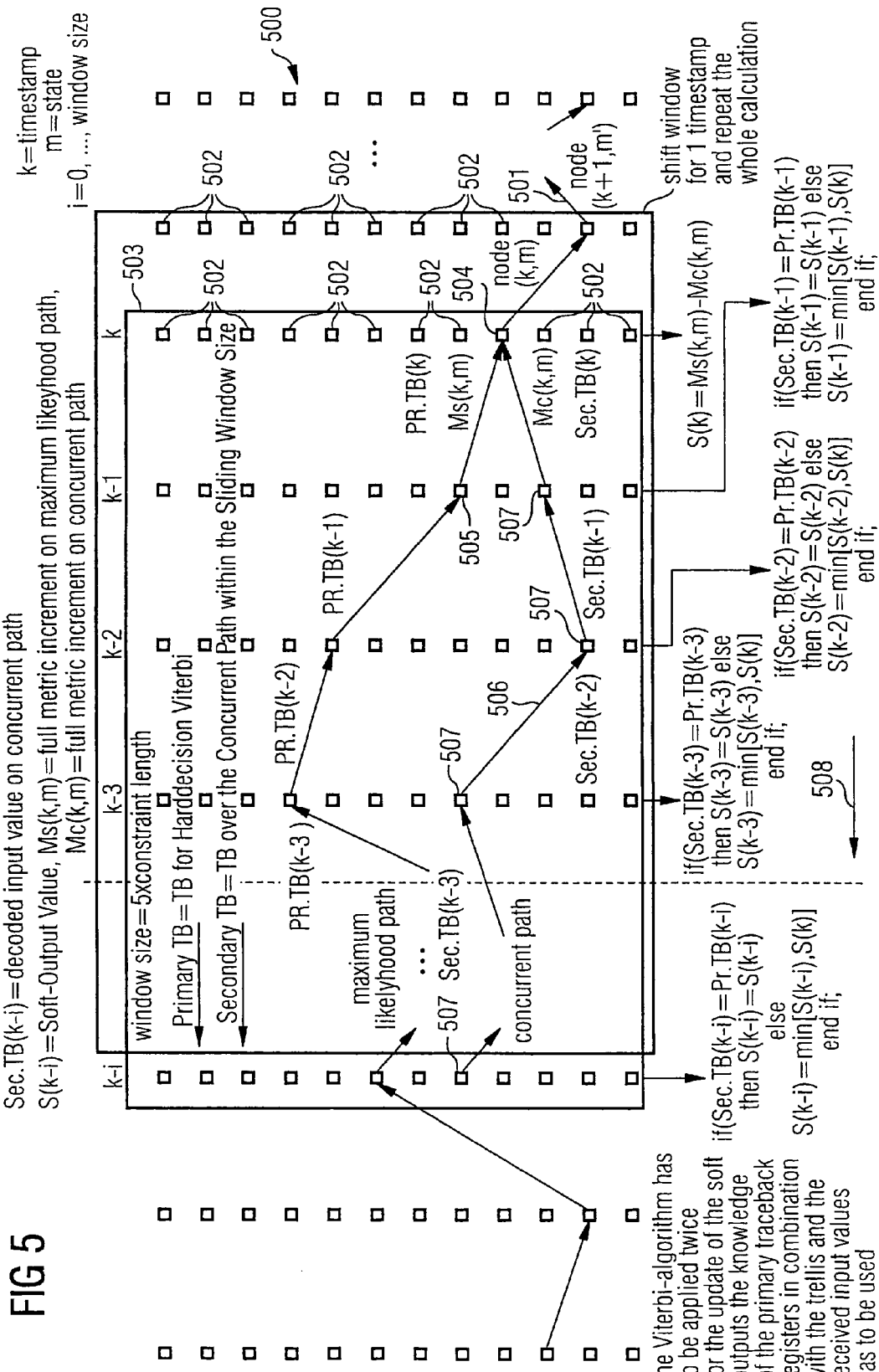
FIG. 5 shows a sketch illustrating the procedure according to the exemplary embodiment of the invention.

FIG. 5 shows the respective states with the reference symbol 502 for one time step in each case for the trellis 500.

The maximum likelihood path 501 contains the signal values determined using the path traceback method and which are used as the decoded physical signals, that is to say as the decoded sequence of the physical signals.

As is illustrated in FIG. 5, the subregion 503 is selected from the overall trellis 500.

The aim of the method described in the following text is to determine the reliability values associated with the individual signal values, in the sense of a "worst case estimate".

In the following text, the signal values of the maximum likelihood path 501 are denoted Pr.TB(k-i) where k-i denotes the times k, k-1, k-2, . . . , k-i that are located in the selected subregion 503. i denotes a sequential index for the times in the subregion 503.

As can be seen, the subregion 503 may be regarded as a window which is in each case shifted by one time step, commencing at the start of the trellis 500 and being shifted through to the end of the trellis 500.

According to the exemplary embodiment, a second path is formed relating to the partial end state 504 of the maximum likelihood path 501 which corresponds to the signal value relating to the time k.

As has been described above, the bit value which has been shifted into the shift register from a previous initial state 505 in order to reach the partial end state 504 on the maximum likelihood path 501 is in fact known.

In order to determine a second path 506 within the trellis 500 for the selected subregion 503 relating to the time k, the transition bit which describes the transition from the state 505 to the partial end state 504 on the maximum likelihood path 501 is inverted, and a renewed path traceback method is carried out with the inverted bit, using the stored path traceback register for the time k (see FIG. 4). This is done in the same way, as described above in conjunction with FIG. 4, as far as the initial state of the trellis.

The result is the second path 506, which contains states 507.

Once the second path has been determined as far as the partial end state 504, a first reliability value is determined for the partial end state 504 in the selected subregion 503 for the time step k.

The first reliability value is obtained from the difference between the state metric of the partial end state 504 for the situation where the metric has been determined via the states of the maximum likelihood path 501, and the state metric for the partial end state 504 for the situation where the state metric has been determined via the states 507 along the second path 506.

As can be seen, this difference represents a measure of the decision certainty for the transition along the maximum likelihood path 501.

If, by way of example, the difference is very small, then this means it would also have been possible to reach that state directly via the second path 506 without involving a statically large error.

However, if the difference is very high, then this is an indication that the decision for the corresponding bit, that is to say the state of the maximum likelihood path 501, is highly reliable.

First reliability values, which still need to be corrected, are thus determined with respect to the time k for all states on the maximum likelihood path 501.

The following method is in each case carried out along the direction symbolized by the arrow 508 in FIG. 5, for a time k−n, n=1, . . . , size of the selected subregion, for the state on the maximum likelihood path 501, and with regard to the state on the second path 506:

- A check is carried out to determine whether the signal value, that is to say the bit, which has been decoded on the basis of the maximum likelihood path 501 is the same as the bit which would have been decoded on the basis of the second path 506.
- If this is the case, then the first reliability value remains unchanged for the signal value of the respective state on the maximum likelihood path 501.
- If the decoded bits relating to a time k−n on the maximum likelihood path 501 and on the second path 506 have different values, then the minimum of the first reliability value which is associated with the respective state on the maximum likelihood path 501 relating to the time k and that of the corresponding state on the maximum likelihood path 501 relating to the respective time k—n is determined and is allocated as a new first reliability value to the signal value on the maximum likelihood path 501 relating to the time k−n.
- This method is carried out along the maximum likelihood path 501 and along the second path 506 for all the states on the maximum likelihood path 501 within the selected subregion 503.

This procedure is carried out for the subregion 503 in each iteration, with the subregion 503 in each case being shifted by one time step along the trellis 500 in the direction of the overall end state of the sequence of physical signals.

The iterative procedure will be explained further, in detail, in conjunction with FIG. 6.

Figure 6:
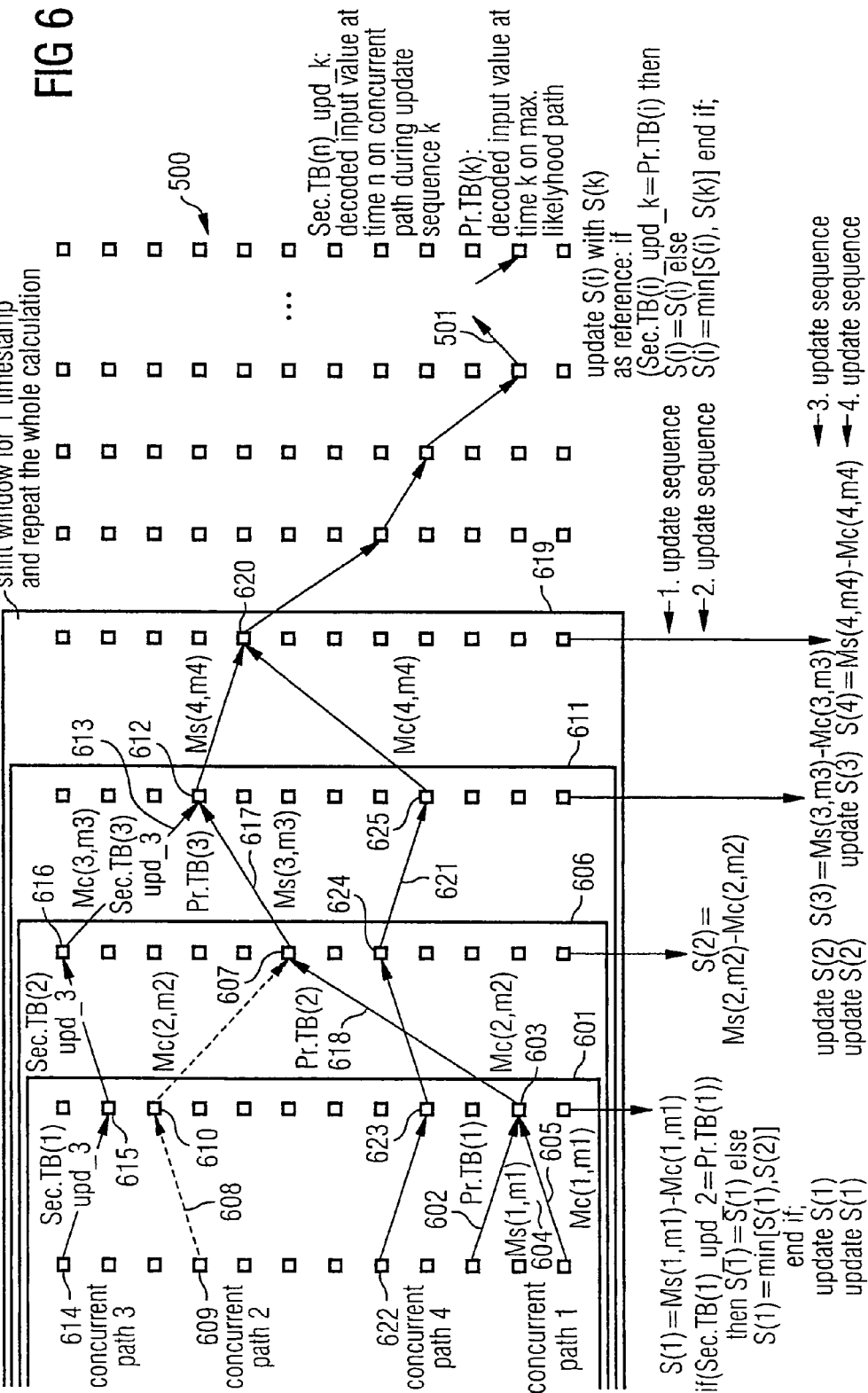
FIG. 6 shows a sketch illustrating the procedure according to the exemplary embodiment of the invention, in detail.

FIG. 6 shows the trellis 500 as well as the maximum likelihood path 501.

In FIG. 6, it is assumed that the method starts at a first time step k=0.

In a first step, a first subregion 601 is selected, which contains the states for two times (k=0, k=1).

As shown in FIG. 6, the first subregion 601 thus contains a first branch 602 of the maximum likelihood path 501.

A second path 604, which has only one branch 605, is determined using the method described above by inversion of the transition bit, starting with the partial end state 603 of the first subregion 601.

The reliability value S(1) is now determined for the first partial end state 603 by forming the difference of the metrics Ms(k=1,m1) for the maximum likelihood path 602 and Mc(k=1,m1) for the second path 604, where Ms(1,m1) accordingly denotes the total metric for the accumulated state metrics and transmission metrics along the maximum likelihood path 501 as far as the first partial end state 603, generally as far as the state m relating to the time k Ms (k, m). Mc(k,m) in a corresponding manner denotes the total metric of the accumulated state metrics and transition metrics along the second path 604 as far as the second partial end state 603, in general as far as the state m relating to the time k.

The first iteration is ended after forming the first reliability value for the time k=1 (S(1)).

A second subregion 606 is selected in a second iteration, which now contains the states of the trellis 500 for the times k=0, k=1, k=2.

In the second iteration, the selected second subregion 606 has a second partial end state 607 on the maximum likelihood path 501.

On the basis of the second partial end state 607, a new path, which is referred to in the following text as the third path 608, is now once again determined by means of the conventional path traceback method using the path traceback register. Furthermore, both the state transition metrics for the second branch 618 of the maximum likelihood path 501, which assesses the state transition from the second partial end state 603 to the second partial end state 607, are determined.

Furthermore, the state metric for the state 610 and the state transition metric for the second partial end state 607, which is located on the third path 608, are determined along the third path 608.

The first reliability value S(2) for the time k=2 for the second partial end state 607 is once again determined using the following rule:

$$S(2)=Ms(2,m2)-Mc(2,m2).$$

In a further step, a check is carried out to determine whether the decoded bit for the time k=1 along the third path 608 starting from the second partial end state 607 is the same as the decoded bit for the maximum likelihood path 501 relating to the time k=1.

If they are not the same, the minimum is formed between the reliability value S(1), which is associated with the first partial end state 603, and the first reliability value S(2) which is associated with the second partial end state 607.

In a further step, the minimum value is allocated to the first partial end state 603.

This completes the second iteration.

In a third iteration, the window (the subregion) is shifted to the right by one further time step, as can be seen, that is to say the selected third subregion 611 now contains states from four times, namely k=0, k=1, k=2, k=3.

The method described above is carried out starting from a third partial end state 612, such that a fourth path 613 is determined by means of a further path traceback method using the corresponding path traceback register.

The total metric along the fourth path 613, which is also referred to as the concurrent path in the following text, is known from the state metric of the state 616 and from the state transition metric in the third partial end state 612.

Furthermore, the state transition metric is determined for the state transition from the second partial end state 607 to the third partial end state 612, symbolized by the third branch 617 on the maximum likelihood path 501. The total metric along the maximum likelihood path 501 is accordingly also known from the state metric for the second partial end state 607.

The first reliability value for the third partial end state 612 is formed using the following rule:

$$S(3)=Ms(3,m3)-Mc(3,m3).$$

Once the first reliability value S(3) for the third partial end state 612 has been determined, the respective first reliability value is or is not updated in accordance with the procedure described above for all the states which are located in the third subregion 611 on the maximum likelihood path 501.

This completes the third iteration.

In the fourth iteration, the subregion is once again shifted by one time step in the direction of the end of the trellis 500, so that a fourth subregion 619 is chosen, which now contains states from five times k=0, k=1, k=2, k=3, k=4.

A fifth path 621 relating to a fourth partial end state 620 on the maximum likelihood path 501 is determined using the above procedure.

The first reliability value S(4) for the fourth partial end state 620 is then determined using the following rule:

$$S(4)=Ms(4,m4)-Mc(4,m4).$$

Starting from the fourth partial end state 620, the first reliability value is in each case updated or is not updated, in accordance with the procedure described above, successively for previous states in time.

Expressed in the form of an if/then request in a programming language, a first reliability value for a respective partial end state relating to a time k is or is not updated on the basis of the following condition:

If (Sec.TB($n\_upd\_k$)=Pr.Tb($n$))

Then $$S(n)=S(n)$$

Else $$S(n)=\min\,(S(n),\,S(k))$$

End If-Then loop.

Sec.TB(n_upd_k) denotes the decoded bit relating to the time n on the respective concurrent path (second path, third path, fourth path, . . . ) during the updating iteration k starting from a partial end state on the maximum likelihood path 501 relating to the time k.

As can be seen, the procedure can be explained by the following heuristic knowledge:

The respective first reliability value at the start of the iteration is the upper limit of the reliability value that is to be output. The smaller is the estimated reliability value for the respective partial end state, the more probable it is that that the partial end state can also be reached via the respective further path. The intermediate reliability value for a state on the maximum likelihood path 501 must therefore be updated within the selected subregion if the corresponding decoded bit relating to the corresponding time differs between the maximum likelihood path 501 and the further path.

Once the reliability values for all the states along the maximum likelihood path 501 have been updated, the time window, that is to say the subregion, is shifted by one time step further in the direction of the end of the trellis.

The new reliability value for the corresponding partial end state relating to the time k+1 is estimated, the corresponding new further path is determined, and the corresponding state metrics and state transition metrics are determined and, once again, the reliability values for the states on the maximum likelihood path 501 within the subregion of the k+1th iteration are updated.

It should be noted that the most recently updated value of the previous subregion in time is finally determined, and is no longer considered in further iterations.

The reliability values of all the states in the time window on the maximum likelihood path 501 are updated in each iteration depending on the rule described above until the corresponding state falls out of the time window when shifted further.

Figure 7:
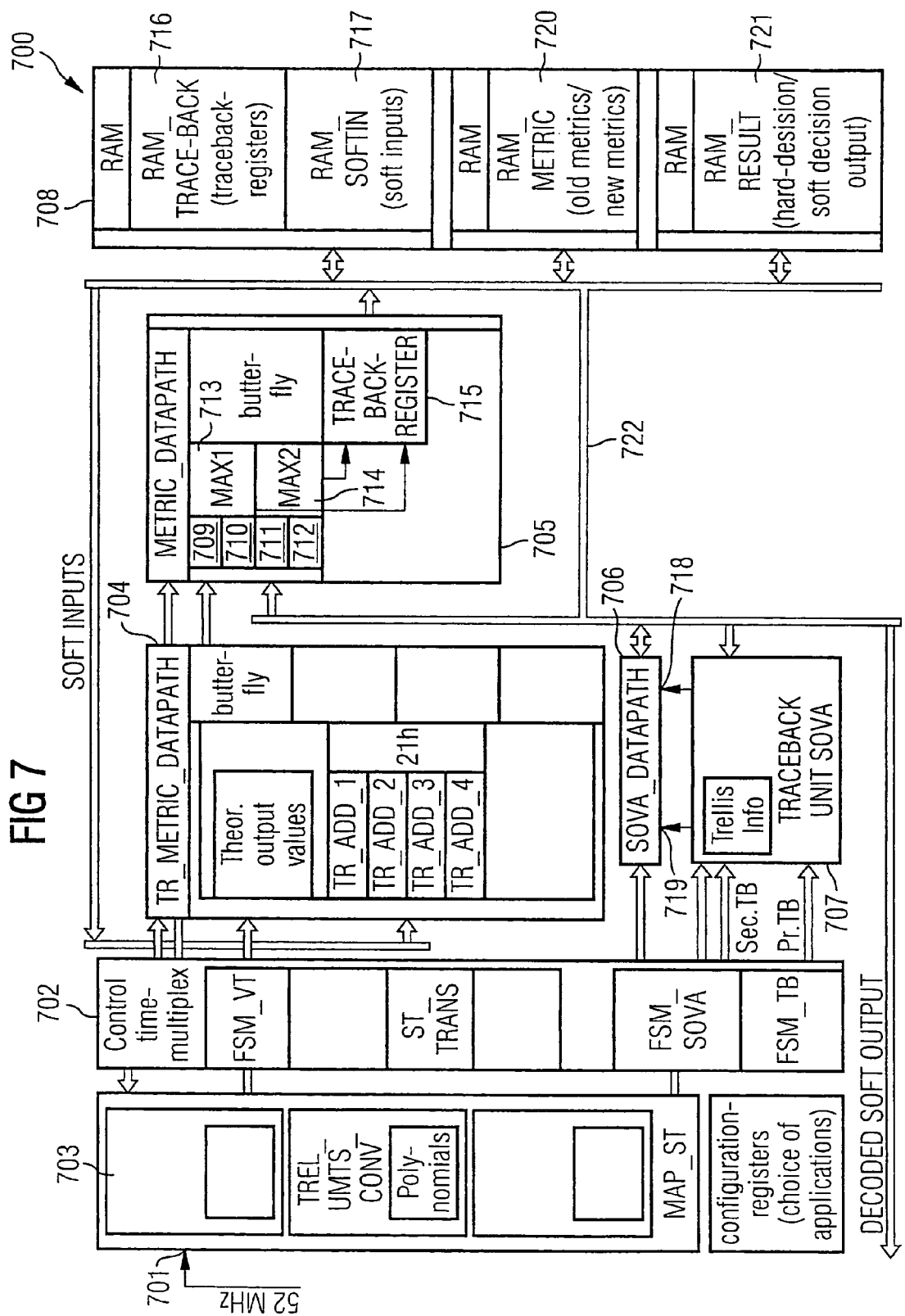
FIG. 7 shows a block diagram of a Viterbi decoding unit according to one exemplary embodiment of the invention.

FIG. 7 shows a block diagram of the Viterbi soft decision decoding unit 700 according to the exemplary embodiment of the invention.

The Viterbi decoding unit 700 is clocked via a clock input 701 by an external controller (not shown), for example a signal processor at a frequency of 52 MHz.

The Viterbi decoding unit 700 has an internal control unit 702, a unit 703 for storing the information relating to the decoding method (convolution polynomials), a transition metric determining unit 704, an end state metric determining unit 705, a reliability value determining unit 706, and a path traceback unit 707.

Furthermore, a memory 708 is provided, which is subdivided into various subregions, for storing the soft input values, the traceback information as well as the decoding bits and their reliability information.

In addition, a memory is provided for storage of the temporary information, such as start metrics.

The transition metric determining unit 707 uses the decoding information, which is stored in the unit 703 for storing the information relating to the decoding method, for each transition in the trellis to form the theoretical coded output information, and combines this with the received soft input values from the memory to form the transition metric values using the following rule:

$$(2x_1-1)S1+(2x_2-1)+(2x_3-1)S3$$

where

S1, S2, S3 denote the soft input values for the decoder, and $x_1, x_2, X_3$ denote the theoretically coded output information.

The end state metric determining unit 705 is coupled to the transition metric determining unit 704 such that the determined state transition metrics can be supplied to it. The end state metric determining unit 705 contains four adders 709, 710, 711, 712, two units 713, 714 for forming a maximum value from two previously formed sums, as well as a path traceback register 715, which are formed on the basis of the butterfly structure 300 illustrated in FIG. 3.

The respective bits which result from the choice of the maximum sum from the state metric for the respective initial state of the butterfly structure 300 and from the state transition metric and are thus shifted out of the shift register on the basis of the method described above are stored in the path traceback register 715.

Figure 1:
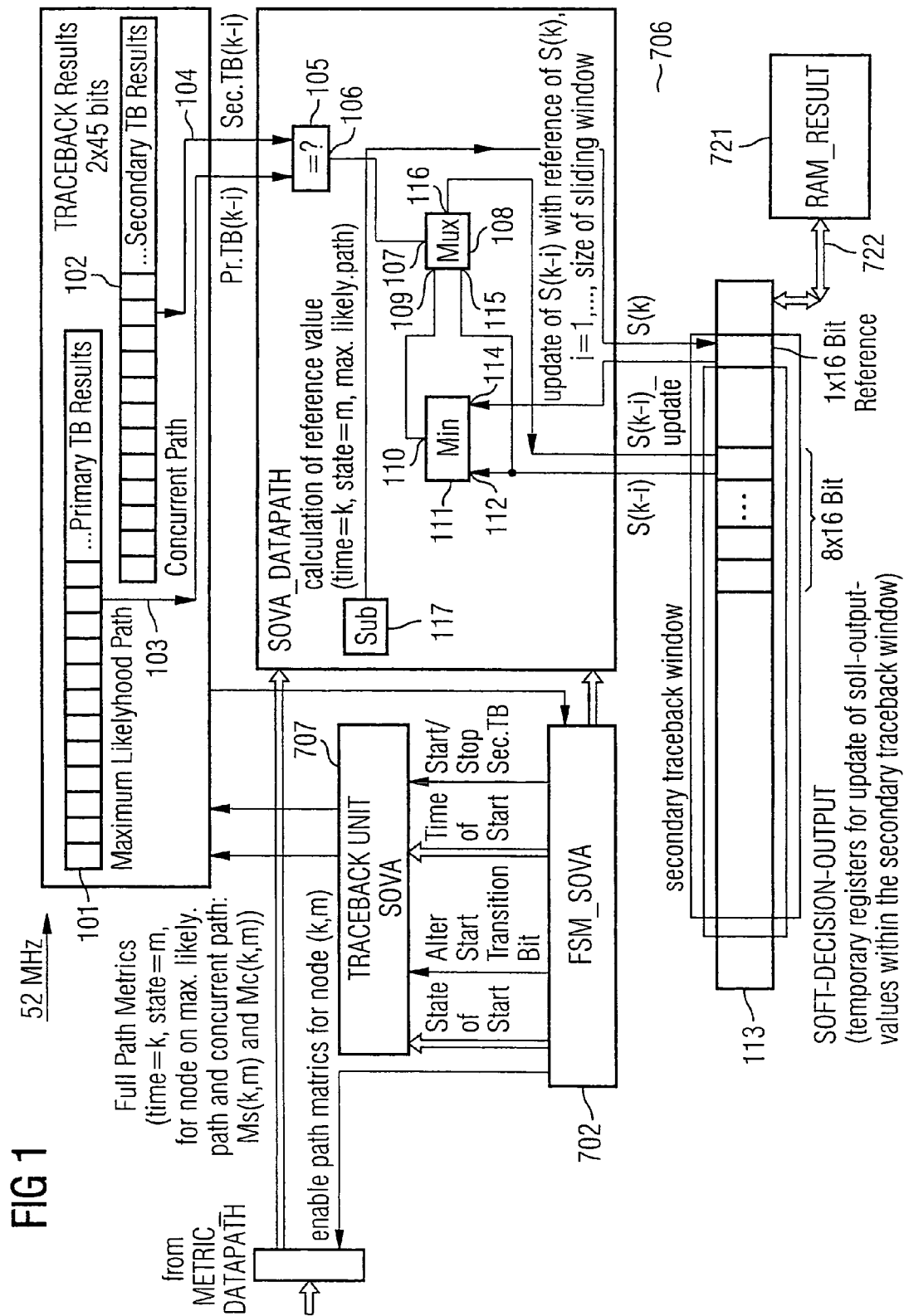
FIG. 1 shows a block diagram illustrating the reliability value determining unit according to one exemplary embodiment of the invention.

The reliability values are determined by the reliability value determining unit 706, which is coupled to the control unit 702 and is illustrated in detail in FIG. 1, using the method described above, and are stored in a second memory area 717 for storing the reliability values and the intermediate reliability values, which may still be changed during the iterations.

Furthermore, the reliability value determining unit 706 is coupled to the path traceback unit 707 such that the corresponding bit, that is to say the transition bit for the respective time step for the states along the respective further path relating to the time stamp k, is supplied from the path traceback unit 707 to the reliability value determining unit 706, as will be explained in the following text, in each case via a first input 718, and the transition bit for the respective states on the maximum likelihood path is supplied from the path traceback unit 707 to the reliability value determining unit 706 via a second coupling 719.

The respectively determined state metrics and state transition metrics are stored in a third memory area 720.

Signal values that are intended to be output and final reliability values which are associated with the signal values are stored in a fourth memory area 721.

The individual components are coupled to one another via a bus 722.

FIG. 1 shows a sketch of the reliability value determining unit 706, in detail. When the subregion has the maximum size of 45 time units, the reliability value determining unit 706 according to the exemplary embodiment has a first register 101 for storing the bits, decoded on the basis of the selected subregion, for the state transitions along the maximum likelihood path.

The decoded bits are stored in a second register 102, likewise with a length of 45 bits, according to the path traceback method, along the respectively determined concurrent path within the selected subregion.

One bit from the first register 101 and one bit from the second register 102, which each describe a decoded bit relating to the same time, are in each case read via a selection unit (not shown) firstly along the maximum likelihood path 501 and along the further concurrent path. These bits are supplied via two couplings, a first coupling 103 and a second coupling 104, to an exclusive-OR gate as the comparison unit 105.

One output 106 of the comparison unit 105 is connected to a control input 107 of a multiplexer 108. A first input 109 of the multiplexer 108 is coupled to an output 110 of a minimum selection unit 111. A first input 112 of the minimum selection unit 111 is coupled to a reliability value memory 113. A second input 114 of the minimum selection unit 111 is likewise coupled to the reliability value memory 113. Furthermore, a second input 115 of the multiplexer 108 is likewise coupled to the first input 112 of the minimum selection unit 111, so that the reliability value which is present at the first input 112 of the minimum selection unit 111 is also present at the second input 115 of the multiplexer 108.

One output 116 of the multiplexer 108 is likewise coupled to the reliability value memory 113.

The control unit 702 controls the reliability value determining unit 706 such that the first reliability value is formed by a subtraction unit 117 in each case for a time k and a state m on the maximum likelihood path, and is stored as the first reliability value S(k) for the respective iteration in which the time step k describes the time step in which the respective partial end state is located.

Furthermore, the reliability value memory 113 is used to store the reliability values and intermediate reliability values S(k−i) determined using the method described above.

The corresponding total metrics for the respective partial end state along the maximum likelihood path 501 are supplied by the end state metric determining unit 705 to the reliability value determining unit 706.

Once the first reliability value S(k) relating to the time k has been determined, the control unit 702 selects reliability values S(k−i) which have not been updated relating to the time k−i, and supplies these to the first input 112 of the minimum selection unit 111.

The first reliability value S(k) is supplied to the second input 114 of the minimum selection unit 111.

The minimum of the two reliability values is thus produced at the output 110 of the minimum selection unit 111, and is hence also applied to the first input 109 of the multiplexer 108.

The reliability value S(k−i) is applied to the second input 115 of the multiplexer 108.

If the check which is carried out by means of the exclusive-OR gate 105 results in the two selected bits from the first register 101 and from the second register 102 differing, then the multiplexer 108 is switched by the output signal from the exclusive-OR gate 105 such that the signal which is applied to the first input 109 of the multiplexer 108 is passed through to the output 116 of the multiplexer 108, and this value replaces the previous reliability value S(k−i), which was applied to the first input 112 of the minimum selection unit 111, as the updated reliability value S(k−i)_upd.

The reliability value memory 113 is coupled via the bus 722 to the fourth memory area 721 so that, after carrying out the second "run" of the Viterbi algorithm, the determined reliability values are stored in the fourth memory area 721.

Figure 8:
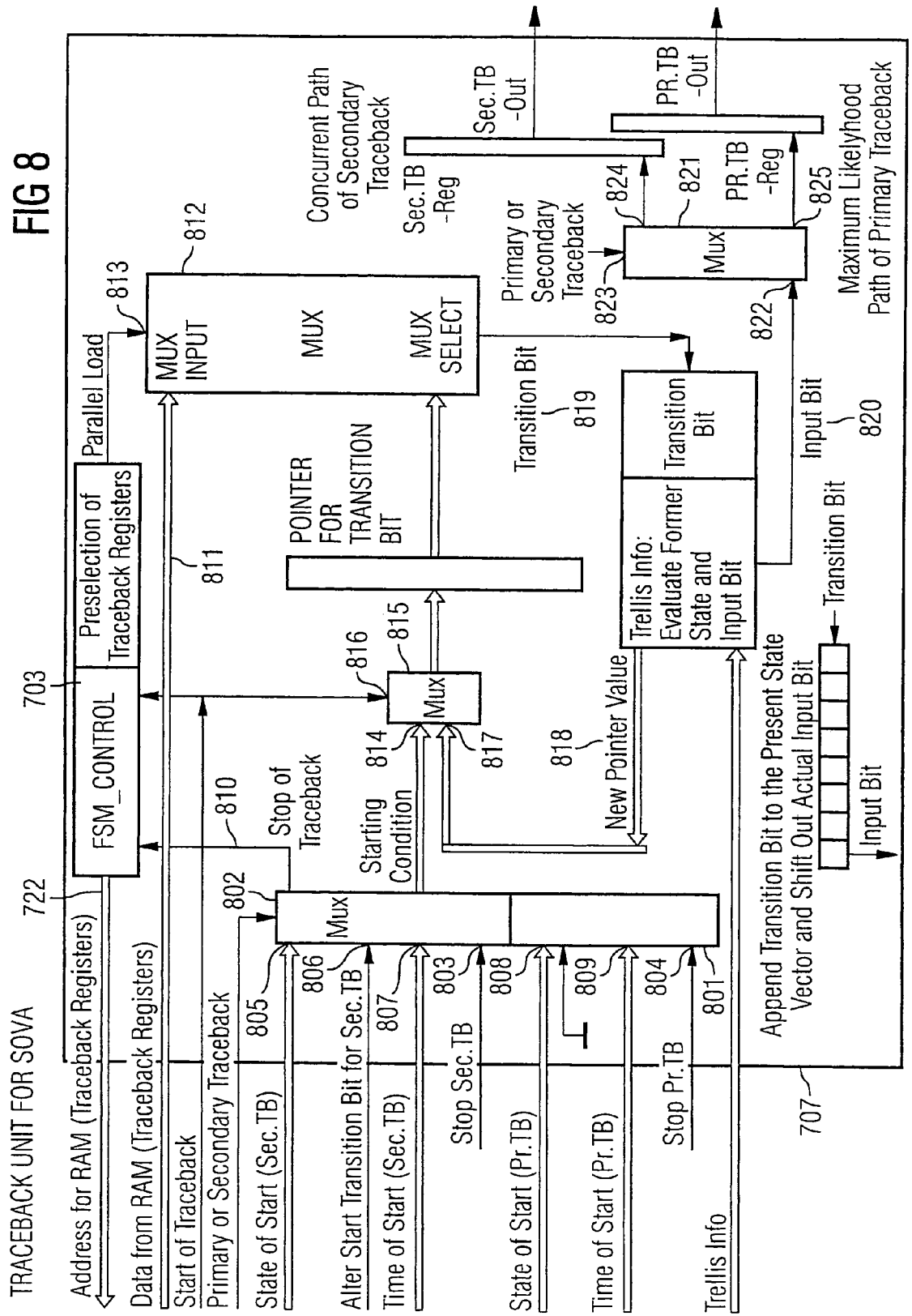
FIG. 8 shows a sketch of a path traceback unit for the Viterbi decoding unit according to one exemplary embodiment of the invention.

FIG. 8 shows the path traceback unit 707 in detail.

The path traceback unit allows both the maximum likelihood path and the further concurrent paths to be traced back. This correspondingly means that input signals exist which refer to both path types and which can be supplied in multiplexed form to the internal logic state.

The path traceback unit 707 has a first multiplexer 801 which is coupled via a control input 802 to the control unit 702 (see FIG. 7). The control input 802 is used to select whether information relating to the maximum likelihood path 501 or relating to the respective further concurrent path is selected by the first multiplexer 801. A stop signal for stopping the processing of information relating to the further path is supplied to the multiplexer 801 via a first stop input 803. A stop signal for stopping the processing of information relating to the maximum likelihood path 501 is supplied to the multiplexer 801 via a second stop input 804.

The respective start state for the path traceback method within the further path is supplied to the multiplexer 801 at a first input 805.

The information as to whether the first transition bit need be inverted for tracing back the further path is supplied to the first multiplexer 801 via a second input 806. The second input 806 is active at the start of the traceback method via the concurrent path, and is inactive during the rest of the traceback method.

The respective time k to which the start state relates is supplied to the first multiplexer 801 via a third input 807.

The start state for the maximum likelihood path 501 is supplied to the first multiplexer 801 via a fourth input 808.

The time to which the start state of the maximum likelihood path 501 relates is supplied to the first multiplexer 801 via a fifth input 809.

A stop signal 810 is supplied from the first multiplexer 801 to the control unit 703 and is used to indicate the completion of the path traceback method.

The address of the respective path traceback register 715 to be read within the first memory area 716 is produced by the control unit 703, and the corresponding bits of the selected path traceback register 715 are read in as input data 811 from the RAM and are supplied to a second multiplexer 812.

The second multiplexer 812 is controlled by the control unit 703 via a control input 813. The start conditions, which are selected by the first multiplexer 801, that is to say the respective start state and the respective start time, are supplied to a first input 814 of a third multiplexer 815.

The third multiplexer 815 thus receives start information from the maximum likelihood path or from the concurrent path.

The third multiplexer 815 is controlled by the control unit 703 via a controlled input 816 of the third multiplexer 816.

The start conditions of the input 814 of the third multiplexer 815 select one bit from the path traceback register for the start time as shown in FIG. 4 (403), which is referred to as the "traceback value" or as the "transition bit", which is attached to the current state vector on the right and thus forms the new pointer value 818. From now on, the respective pointers which are supplemented in each time step select the transition bit of the respectively previous time step.

A second input 817 of the third multiplexer 815 is supplied with a value which represents the respectively new pointer value 818 of the previous time step in time and of the state in the trellis 500 on the basis of the path traceback register 715 loaded into the second multiplexer 812, and on the basis of the associated transition bit which is determined by the pointer for determining the transition bit 819.

The path traceback unit requires information relating to the coding method that is used, such as the number of states and hence the number of bits in the state vector. This information is required not only for producing the new pointer value but also for preselection of the path traceback register 715 (size of the path traceback register 715).

The bit which is shifted out on the basis of the path traceback method described above is used as a decoded bit, which corresponds to the corresponding signal value on the maximum likelihood path or on the further path.

The decoded bit 820, that is to say the bit which is shifted out of the corresponding shift register, is supplied to an input 822 of a fourth multiplexer 821.

The bit is supplied to a first output 824 or to a second output 825 depending on a control signal at a control input 823 of the fourth multiplexer 821. If the bit is supplied to the first output 824, then this means that the bit is associated with the further path. If the bit is supplied to the second output 825, then this means that the bit is associated with the associated likelihood path.

The control unit 702 is set up such that the method steps described above can be carried out by the reliability value determining unit 706 and the corresponding further units of the Viterbi decoding unit 700.

The following publications are cited in this document:
Forney G. D. Forney, The Viterbi-Algorithm, Proceedings of the IEEE, Vol. 61, No. 3, pages 268–278, 1973
[2] J. Hagenauer, P. Hoeher, A Viterbi Algorithm with Soft-Decision Outputs and its Applications, pages 1680–1686, GLOBECOM, 1989
[3] J. Hagenauer, Source-Controlled Channel Decoding, IEEE Transaction on Communications, Vol. 43, No. 9, pages 2449–2457, September 1995
[4] C. Berrou et al, A Low Complexity Soft-Output Viterbi Decoder Architecture, ICC 93.
[5] U.S. Pat. No. 5,406,570
[6] Patent Abstracts of Japan JP 11186914 A
[7] U.S. Pat. No. 5,784,392

LIST OF REFERENCE SYMBOLS

101 First register
102 Second register
103 First coupling
104 Second coupling
105 Comparison unit
106 Comparison unit output
107 Multiplexer control input
108 Multiplexer
109 Multiplexer first input
110 Minimum selection unit output
111 Minimum selection unit
112 Minimum selection unit first input
113 Reliability value memory
114 Minimum selection unit second input
115 Multiplexer second input
116 Multiplexer output
200 Transmitter
201 Source
202 Message
203 Source coder
204 Code word
205 Unit for channel coding
206 Channel code word
207 Unit for modulation 207 of the channel code word
208 Physical channel
209 Modulated signal
210 Disturbance
211 Receiver
212 Modified modulated signal
213 Unit for demodulation
214 Electrical signal
215 Unit for channel decoding
216 Reconstructed code word
217 Source decoding
218 Decoded signal
219 Sink
300 Butterfly structure
301 First initial state
302 Second initial state
303 State transition arrow
304 State transition arrow
305 State transition arrow
306 State transition arrow
307 First end state
308 Second end state
I1 First state transition metric
I2 Second state transition metric
I3 Third state transition metric
I4 Fourth state transition metric
401 Start state path traceback method
402 Pointer to a bit in the path traceback register for the time k
403 Bit in the path traceback register for the time k
404 Path traceback register for the time k
405 Decoded signal value for the time k
406 Path traceback state for the time k−1
407 Pointer to a bit in the path traceback register for the time k−1
408 Path traceback register for the time k−1
409 Bit in the path traceback register for the time k−1
410 Decoded signal value for the time k−1
500 Trellis
501 Maximum likelihood path
502 States in the trellis
503 Subregion
504 Partial end state
505 State preceding the partial end state on the maximum likelihood path
506 Second path
507 States of the second path
508 Arrow Pr.TB(k−j) Transition bit on the maximum likelihood path
Sec.TB(k−j) Transition bit on the second path
601 First subregion
602 First branch maximum likelihood path
603 First partial end state
604 Second path
605 Branch on second path
606 Second subregion
607 Second partial end state
608 Third path
609 State on the third path
610 State on the third path
611 Third subregion
612 Third partial end state
613 Fourth part
614 State of the fourth path
615 State of the fourth path
616 State of the fourth path
617 First branch on the maximum likelihood path
618 Second branch on the maximum likelihood path
619 Fourth subregion
620 Fourth partial end state
621 Fifth path
622 State on the fifth path
623 State on the fifth path
624 State on the fifth path
625 State on the fifth path
700 Viterbi decoding unit
701 Clock input
702 Control unit
703 Signal reception memory
704 Metric determining unit
705 End state determining unit
706 Reliability value determining unit
707 Path traceback unit
708 Memory
709 Adder
710 Adder
711 Adder
712 Adder
713 Maximum selection unit
714 Maximum selection unit
715 Path traceback register
716 First memory area
717 Second memory area
718 First coupling
719 Second coupling
720 Third memory area
721 Fourth memory area
722 Bus
801 First multiplexer
802 Multiplexer control unit
803 First stop input
804 Second stop input
805 First multiplexer first input
806 First multiplexer second input
807 First multiplexer third input
808 First multiplexer fourth input
809 First multiplexer fifth input
810 Stop signal
811 Input data
812 Second multiplexer
813 Second multiplexer control input
814 Third multiplexer first input
815 Third multiplexer
816 Third multiplexer control input
817 Third multiplexer second input
818 New pointer value for the next state in time in trellis
819 Transition bit
820 Decoded bit
821 Fourth multiplexer
822 Fourth multiplexer input
823 Fourth multiplexer control input
824 Fourth multiplexer first output
825 Fourth multiplexer second output
901 Trellis half
802 First subregion
903 Second subregion

The invention claimed is:

1. A method for decoding a sequence of physical signals, comprising:
   carrying out a Viterbi algorithm a first time for all physical signals, as a result of which a maximum likelihood path is determined along the overall trellis which results on the basis of the Viterbi algorithm, and with one signal value being determined for each physical signal;
   determining a reliability value for each signal value of the maximum likelihood path determined on the basis of the Viterbi algorithm;
   carrying out the Viterbi algorithm a second time, with the following method steps being carried out iteratively until all the signal values of the determined trellis have been taken into account:
   a) selecting one subregion of the trellis, with that subregion having a partial initial signal value and a partial end signal value on the maximum likelihood path;
   b) determining at least one further path in that subregion of the trellis which ends at the partial end signal value of the maximum likelihood path;
   c) comparing each signal value on the further path with each signal value on the maximum likelihood path;
   d) forming the minimum of the reliability value associated with the signal value and of the reliability value of the partial end signal value for each signal value on the maximum likelihood path, wherein
   e) the reliability value or the minimum is selected and is associated with the respective signal value according to a predetermined criterion; and
   using the determined signal values and the selected reliability values associated with the signal values as the decoded sequence.

2. The method as claimed in claim 1, in which a binary value is used as the signal value.

3. The method as claimed in claim 1, in which at least one initial signal value is predetermined at the start of the sequence of physical signals and/or at least one end signal value is predetermined at the end of the sequence of physical signals.

4. The method as claimed in claim 1, in which an area which has a predetermined number of signal values is in each case selected as the subregion of the trellis.

5. The method as claimed in claim 4, in which a number of signal values are each used as one subregion of the trellis, with this number being dependent on the reversion depth of the convolution polynomial that is used.

6. The method as claimed in one of claims 1 to 5, in which the further path is determined in the following way:
   inverting the transition bit which has led to the partial end signal value according to the maximum likelihood path;
   carrying out a path traceback method is by means of path traceback information which was determined during the first run of the Viterbi algorithm and during the current run of the Viterbi algorithm, based on the partial end signal value, and with the renewed path traceback method being started with the inverted transition bit.

7. The method as claimed in claim 6, in which the difference between accumulated signal value metrics which are formed on the basis of the Viterbi algorithm is used as the reliability value.

8. The method as claimed in claim 7, in which the difference between accumulated signal value metrics or the minimum of the reliability value and the reliability value of the partial end signal value is in each case chosen for the signal value, and is associated with the signal value.

9. A reliability value determining unit for determining a reliability value in the course of a Viterbi algorithm, comprising:
a first path memory for storing signal values of a maximum likelihood path on the basis of the Viterbi algorithm;
a second path memory for storing signal values of a further path on the basis of the Viterbi algorithm;
a first selection unit, which is coupled to the first path memory and to the second path memory, for selecting signal values from the first path memory and from the second path memory;
a comparison unit, which is coupled to the first selection unit, for comparing the selected signal values from the first path memory and from the second path memory;
a second selection unit which has,
  a) a control input which is coupled to the output of the comparison unit,
  b) a first input which is coupled to the output of a third selection unit,
  c) a second input;
a reliability value memory for storing reliability values; and
a control unit which is set up such that
  a) a previously determined and stored first reliability value, which is associated with a signal value on the maximum likelihood path, can be supplied from the reliability value memory to a first input of the third selection unit,
  b) a previously determined and stored second reliability value which is associated with a signal value on the maximum likelihood path can be supplied from the reliability value memory to a second input of the third selection unit,
  c) the first reliability value can be supplied to the second input of the second selection unit,
  d) the value which is selected by the second selection unit can be stored as the first reliability value;
in which case, if the selected signal values from the first path memory and from the second path memory are not the same, the comparison unit can supply a control signal to the second selection unit such that the second selection unit can select that reliability value which is applied to its first input and has been selected by the third selection unit.

10. The reliability value determining unit as claimed in claim 9, in which the control unit is set up such that a previously determined and stored second reliability value, which is associated with the partial end signal value of the maximum likelihood path, can be supplied from the reliability value memory to the second input of the third selection unit.

11. The reliability value determining unit as claimed in claim 9, in which the second selection unit is a multiplexer.

12. The reliability value determining unit as claimed in claim 9, in which the first selection unit is set up such that signal values are in each case selected for the same time unit.

13. The reliability value determining unit as claimed in claim 9, in which the third selection unit is set up such that it selects the lower reliability value of the first reliability value and the second reliability value.

14. The reliability value determining unit as claimed in claim 9, in which the control unit is set up such that the reliability values of all the signal values of the maximum likelihood path can be supplied iteratively as the first reliability value to the first input of the third selection unit.

15. A Viterbi decoding unit having a reliability value determining unit as claimed in one of claims 9 to 14.

16. A device for decoding a sequence of physical signals, having a processor which is set up such that the following method steps can be carried out:
determining a maximum likelihood path along the overall trellis which results on the basis of the Viterbi algorithm for all the physical signals based on a first run of a Viterbi algorithm, as a result of which one signal value is determined for each physical signal;
determining a reliability value for each signal value of the maximum likelihood path determined on the basis of the Viterbi algorithm;
carrying out the Viterbi algorithm a second time, with the following method steps being carried out iteratively until all the signal values of the determined trellis have been taken into account:
  a) selecting one subregion of the trellis, with that subregion having a partial initial signal value and a partial end signal value on the maximum likelihood path;
  b) determining at least one further path in that subregion of the trellis which ends at the partial end signal value of the maximum likelihood path;
  c) comparing each signal value on the further path with each signal value on the maximum likelihood path;
  d) forming the minimum of the reliability value associated with the signal value and of the reliability value of the partial end signal value for each signal value on the maximum likelihood path, wherein
  e) the reliability value or the minimum is selected and is associated with the respective signal value according to a predetermined criterion; and
using the determined signal values and the selected reliability values associated with the signal values as the decoded sequence.

17. The device as claimed in claim 16, further comprising:
a transition metrics determining unit for determining a transition metric;
an end state metric determining unit, which is coupled to the transition metric determining unit, for determining an end state metric;
a reliability value determining unit which is coupled to the end state metric determining unit; and
a path traceback unit, which is coupled to the reliability value determining unit and to the end state detection metric determining unit, for determining path traceback information.

18. The device as claimed in claim 16 or 17, having further comprising a memory
with a memory area for storing path traceback information;
having a second memory area for storing soft input information for the decoding unit; and/or with a third memory area for storing determined state metrics and state transition metrics;

with a fourth memory area for storing signal values which are intended to be output, and reliability values associated with the signal values.

19. The device as claimed in claim 18, in which at least one of the memory areas is in the form of RAM.

20. The device as claimed in one of claim 17 or 18, in which the path traceback unit has the following components:

a control unit;

a multiplexer which is coupled via a control input to the control unit, in which case it is possible to use the control unit to select whether information about the maximum likelihood path or about the respective further concurrent path is selected by the first multiplexer, in which case the respective start state for the path traceback method within the further concurrent path can be supplied to a first input of the first multiplexer, in which case information as to whether a transition bit is intended to be inverted for the traceback of the further path can be supplied as a second input of the first multiplexer, in which case the respective time to which the start state relates can be supplied at a third input of the first multiplexer, in which case the respective start state of the maximum likelihood path can be supplied at a fourth input of the first multiplexer, and in which case the respective time to which the start state of the maximum likelihood path relates can be supplied as a fifth input of the first multiplexer.

21. The device as claimed in claim 16 or 17, further comprising a memory with a memory area for storing path traceback information; or having a second memory area for storing soft input information for the decoding unit; or with a third memory area for storing determined state metrics and state transition metrics;or with a fourth memory area for storing signal values which arc intended to be output, and reliability values associated with the signal values.

* * * * *

UNITED STATES PATENT AND TRADEMARK OFFICE
CERTIFICATE OF CORRECTION

PATENT NO. : 7,085,992 B2  Page 1 of 1
APPLICATION NO. : 10/381542
DATED : August 1, 2006
INVENTOR(S) : Becker et al.

It is certified that error appears in the above-identified patent and that said Letters Patent is hereby corrected as shown below:

On the Title page, Item (75) listed as *Inventors:* please add after the last inventor's name the following information -- Peter Schmidt, Erpolzheim, (DE); Michael Schneider, Munchen (DE) --.

On the Title page, Item (30) listed as *Foreign Application Priority Data* please delete the priority number " 100 52 709 " and add -- 100 52 709.4 --.

Column 1, line 65 please delete the word "Commucications." and add -- Communications. --.

Column 22, line 62, Claim 18 delete the word " having ".

Signed and Sealed this

Twelfth Day of June, 2007

JON W. DUDAS
*Director of the United States Patent and Trademark Office*